(12) United States Patent
Kim

(10) Patent No.: US 8,988,892 B2
(45) Date of Patent: Mar. 24, 2015

(54) SUBSTRATE AND ELECTRONIC DEVICE INCLUDING THE SUBSTRATE

(75) Inventor: Young-bae Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 282 days.

(21) Appl. No.: 13/590,133

(22) Filed: Aug. 20, 2012

(65) Prior Publication Data

US 2013/0120952 A1 May 16, 2013

(30) Foreign Application Priority Data

Nov. 10, 2011 (KR) .................. 10-2011-0117159

(51) Int. Cl.
| | |
|---|---|
| H05K 1/18 | (2006.01) |
| H05K 1/02 | (2006.01) |
| H01L 23/498 | (2006.01) |
| H05K 3/46 | (2006.01) |

(52) U.S. Cl.
CPC ........ *H01L 23/49822* (2013.01); *H05K 3/4688* (2013.01); *H05K 1/0271* (2013.01); *H05K 1/181* (2013.01); *H05K 2201/068* (2013.01); *H01L 2224/16225* (2013.01)
USPC .......................................... 361/783; 174/250

(58) Field of Classification Search
CPC .................. H05K 2201/068; H05K 23/49822; H05K 1/181; H05K 3/4688

USPC .......................................... 361/783; 174/250
See application file for complete search history.

(56) References Cited

U.S. PATENT DOCUMENTS

| 6,248,959 B1 * | 6/2001 | Sylvester ...................... 174/256 |
| 2012/0024582 A1 * | 2/2012 | Maeda et al. .................. 174/258 |

FOREIGN PATENT DOCUMENTS

| JP | 2005-340686 | | 12/2005 |
| JP | 2011-068908 | | 4/2011 |
| KR | 20100081863 A | * | 7/2010 |
| KR | 1020100081863 A | | 7/2010 |

* cited by examiner

*Primary Examiner* — Timothy Thompson
*Assistant Examiner* — Charles Pizzuto
(74) *Attorney, Agent, or Firm* — Renaissance IP Law Group LLP

(57) ABSTRACT

A substrate and an electronic device including the substrate are described. The substrate includes a first surface configured such that a semiconductor package or a semiconductor die is installable thereon, and a second surface facing the first surface, wherein, with respect to a central plane disposed between the first surface and the second surface at equal distances therefrom, a coefficient of thermal expansion in a first portion between the first surface and the central plane is configured to be higher than a coefficient of thermal expansion in a second portion between the second surface and the central plane configured to be. By using the substrate, undesirable overall shape deformation during semiconductor installation may be reduced or relieved.

20 Claims, 7 Drawing Sheets

SUBSTRATE AND ELECTRONIC DEVICE INCLUDING THE SUBSTRATE

CROSS-REFERENCE TO RELATED APPLICATIONS

This application claims the benefit of Korean Patent Application No. 10-2011-0117159, filed on Nov. 10, 2011, in the Korean Intellectual Property Office, the disclosure of which is incorporated herein in its entirety by reference.

BACKGROUND

The inventive concept relates to a substrate and an electronic device including the substrate, and more particularly, to a substrate capable of removing or relieving an overall shape deformation during semiconductor installation.

As the size of electronic products gets smaller, internal components of the electronic products may also need to be thinner. Specifically, when a variety of different components are installed on a multi-layer substrate, the deformation of an overall shape of the electronic products can prevent further downsizing of the internal components in the electronic products. Accordingly, a new shape deformation prevention strategy is required for the additional miniaturization of the electronic products to avoid undesirable warping of a substrate mounting components thereon.

SUMMARY

The inventive concept provides a substrate capable of removing or relieving an overall shape deformation during semiconductor installation.

The inventive concept also provides an electronic device in which an overall shape deformation is removed or relieved during semiconductor installation.

According to an aspect of the inventive concept, there is provided a substrate including a first surface configured such that a semiconductor package or a semiconductor die is installable thereon, and a second surface facing the first surface, wherein, with respect to a center plane disposed between the first surface and the second surface at equal distances therefrom, a coefficient of thermal expansion in a first portion between the first surface and the center plane is higher than a coefficient of thermal expansion in a second portion between the second surface and the center plane.

The first and second portions may each include at least one prepreg (PPG) layer, wherein a coefficient of thermal expansion of a material forming the at least one PPG layer of the first portion is higher than a coefficient of thermal expansion of a material forming the at least one PPG layer of the second portion. Alternatively, the first and second portions may each include at least one PPG layer, wherein a thickness of the at least one PPG layer of the first portion is thicker than a thickness of the at least one PPG layer of the second portion.

The first and second portions may each include at least one metal layer, wherein a coefficient of thermal expansion of a material forming the at least one metal layer of the first portion is higher than a coefficient of thermal expansion of a material forming the at least one metal layer of the second portion. Alternatively, the first and second portions may each include at least one metal layer, wherein a thickness of the at least one metal layer of the first portion is thicker than a thickness of the at least one metal layer of the second portion.

The substrate may include: solder resist (SR) layers forming the first and second surfaces; a core layer disposed between the SR layers; and a metal layer and a prepreg (PPG) layer disposed between the core layer and the SR layers, wherein the metal layer and the PPG layer disposed between the first surface and the core layer and the metal layer and the PPG layer disposed between the second surface and the core layer are disposed in a symmetrical configuration about the core layer, and a thickness from the core layer to the first surface is thicker than a thickness from the core layer to the second surface.

A thickness of the metal layer disposed between the first surface and the core layer may be thicker than a thickness of the metal layer disposed between the second surface and the core layer. Alternatively, a thickness of the PPG layer disposed between the first surface and the core layer may be thicker than a thickness of the PPG layer disposed between the second surface and the core layer. Furthermore, a coefficient of thermal expansion of a material forming the PPG layer disposed between the first surface and the core layer may be higher than a coefficient of thermal expansion of a material forming the PPG layer disposed between the second surface and the core layer.

The substrate may include: solder resist (SR) layers forming the first and second surfaces; a core layer disposed between the SR layers, and a metal layer and a prepreg (PPG) layer disposed between the core layer and the SR layers, wherein the metal layer and the PPG layer disposed between the first surface and the core layer and the metal layer and the PPG layer disposed between the second surface and the core layer are disposed in a symmetrical configuration about the core layer, a thickness from the core layer to the first surface is substantially the same as a thickness from the core layer to the second surface, and a coefficient of thermal expansion of a material forming the PPG layer disposed between the first surface and the core layer is higher than a coefficient of thermal expansion of a material forming the PPG layer disposed between the second surface and the core layer. Alternatively, the substrate may include: solder resist (SR) layers forming the first and second surfaces; a core layer disposed between the SR layers, and a metal layer and a prepreg (PPG) layer disposed between the core layer and the SR layers, wherein the metal layer and the PPG layer disposed between the first surface and the core layer and the metal layer and the PPG layer disposed between the second surface and the core layer are disposed in a symmetrical order about the core layer, a thickness from the core layer to the first surface is substantially the same as a thickness from the core layer to the second surface, and a coefficient of thermal expansion of a material forming the metal layer disposed between the first surface and the core layer is higher than a coefficient of thermal expansion of a material forming the metal layer disposed between the second surface and the core layer.

The substrate may include: solder resist (SR) layers forming the first and second surfaces; at least three odd-numbered metal layers disposed between the SR layers; and prepreg (PPG) layers disposed between the at least three odd-numbered metal layers, wherein a coefficient of thermal expansion of the PPG layer disposed between the center plane and the first surface is higher than a coefficient of thermal expansion of the PPG layer disposed between the center plane and the second surface.

The substrate may include solder resist (SR) layers forming the first and second surfaces; at least three odd-numbered metal layers disposed between the SR layers; and prepreg (PPG) layers disposed between the at least three odd-numbered metal layers, wherein a coefficient of thermal expansion of the metal layer disposed between the center plane and the first surface is higher than a coefficient of thermal expansion of the metal layer disposed between the center plane and the second surface.

According to another aspect of the inventive concept, there is provided a substrate including a first surface configured such that a semiconductor package or a semiconductor die is installable thereon, and a second surface facing the first surface, wherein the substrate includes: solder resist (SR) layers forming the first and second surfaces; a core layer disposed between the SR layers; and a metal layer and a prepreg (PPG) layer disposed between the core layer and the SR layers, wherein an overall coefficient of thermal expansion of layers between the core layer and the first surface is higher than an overall coefficient of thermal expansion of layers between the core layer and the second surface.

According to another aspect of the inventive concept, there is provided an electronic device including: the substrate described above; and a semiconductor package or a semiconductor die installed on the substrate.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

The inventive concept will now be described more fully with reference to the accompanying drawings, in which exemplary embodiments of the inventive concept are shown. The inventive concept may, however, be embodied in many different forms by one of ordinary skill in the art without departing from the technical teaching of the inventive concept. In other words, particular structural and functional descriptions of the inventive concept are provided in descriptive sense only; various changes in form and details may be made therein and thus should not be construed as being limited to the embodiments set forth herein. As the inventive concept is not limited to the embodiments described in the present description, and thus it should not be understood that the inventive concept includes every kind of variation examples or alternative equivalents included in the spirit and scope of the inventive concept.

In the present description, terms such as 'first', 'second', etc. are used to describe various elements. However, it is obvious that the elements should not be defined by these terms. The terms are used only for distinguishing one element from another element. For example, a first element alternatively could be termed a second element and a second element alternatively could be termed a first element, without departing from the teaching of the inventive concept.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meanings as are commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Expressions such as "at least one of," when preceding a list of elements, modify the entire list of elements and do not modify the individual elements of the list.

As used herein, the term "and/or" includes any and all combinations of one or more of the associated listed items.

Figure 1A:
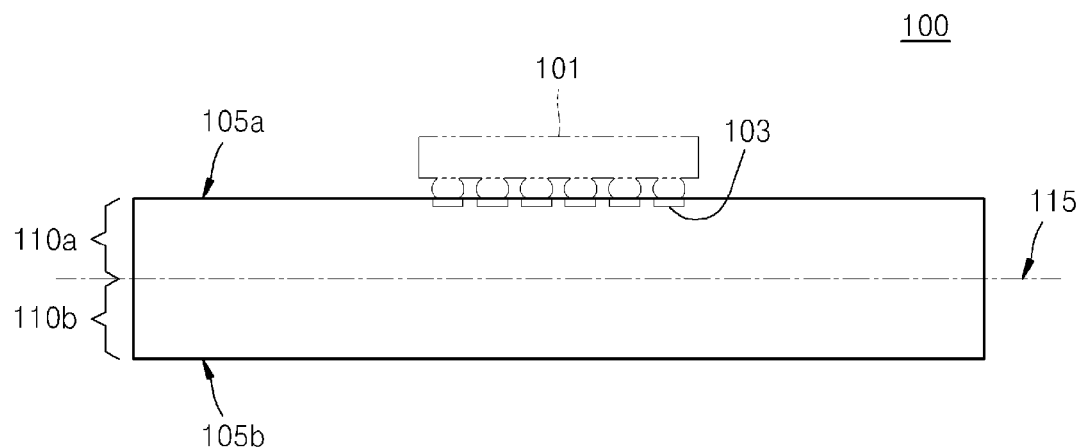
FIG. 1A is a schematic view of a side cross-section of a substrate according to an embodiment of the inventive concept.

FIG. 1A is a cross-sectional schematic view of a substrate 100 illustrating the inventive concept according to some embodiment.

Referring to FIG. 1A, the nominally planar substrate 100 has an upper surface and a lower surface each having sufficiently larger areas compared to its side surfaces. The upper surface of the substrate 100 is configured such that a semiconductor package or semiconductor die 101 can be mounted thereon, and is hereinafter referred to as a first surface 105a. one or more connection terminals, such as a connection pad 103, and wires or conductive traces may be coupled to the first surface 105a to mount the semiconductor package or semiconductor die 101 thereon. Also, at least a part of top of the first surface 105a may be encapsulated later by using an encapsulation material so as to cover the semiconductor package or semiconductor die 101.

The lower surface on the opposite side of the first surface 105a is hereinafter referred to as a second surface 105b. The second surface 105b typically does not include a connection terminal (as illustrated), although the inclusion of one or more such connection terminals is within the scope of the invention.

The substrate 100 thus conceptually is divided into two portions. In other words, the substrate 100 may be divided into a first portion 110a closer to the first surface 105a and a second portion 110b closer to the second surface 105b, the two portions defining a central or center plane 115 therebetween, the center plane being disposed at equal distances between the first and second surfaces 105a and 105b. The center plane 115 is a virtual plane, as defined above, and may or may not be physically disposed at an interface of a certain material layer.

The substrate 100 may be a printed circuit board (PCB), and may have a stacked structure including layers of a plurality of materials. The layers may include at least one metal layer and at least one prepreg (PPG) layer. Examples of a metal forming the metal layer include copper (Cu), gold (Au), platinum (Pt), silver (Ag), nickel (Ni), aluminum (Al), invar, and/or a metal alloy, but are not limited thereto.

The PPG layer may be a layer formed by impregnating a matrix fiber, such as a glass fiber or a carbon fiber, with a polymer, such as an epoxy resin, a phenol resin, or a polyimide resin. The matrix fiber may be oriented in one direction or may be woven in a cross-pattern. At least one of the PPG layers may be in a hardened or cured state during the manufacture of the substrate 100. Alternatively, at least one of the PPG layers may be applied in a non-hardened or semi-hardened state and then may be hardened or cured during a processing operation.

Properties of the PPG layers may be the same as or different from each other. Specifically, coefficients of thermal expansion (CTE) of the PPG layers may be the same as or different from each other, as will be described below with reference to FIG. 1B.

A solder resist (SR) layer (not shown) may be formed on an outermost portion of the substrate 100. The SR layer may be formed on one of or both of the two main surfaces of the substrate 100. Also, an outer surface of the SR layer may be the first surface 105a and/or the second surface 105b.

The SR layer may be formed of an acryl-based resin, an epoxy-based resin, an urethane-based resin, a silicone-based resin, a paraxylene-based resin, or a parylene-based resin by using a dipping, spraying, flow coating, vacuum coating, or any other suitable method. Also, the SR layer may mechanically protect the substrate 100, may prevent corrosion of the substrate 100, and may improve electric characteristics of the substrate 100.

Figure 1B:
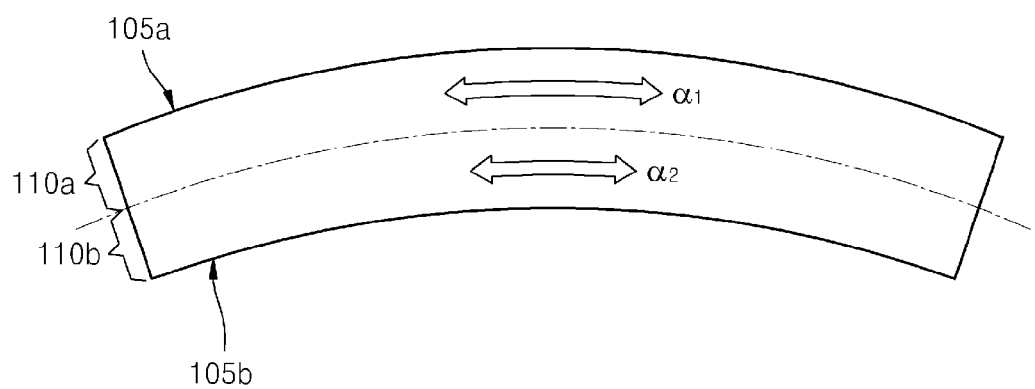
FIG. 1B is a schematic, cross-sectional view showing a deformation of the substrate of FIG. 1A when a temperature of the substrate is increased, according to an embodiment of the inventive concept.

FIG. 1B is a schematic view showing in intentionally exaggerated form (for the sake of clarity) a deformation of the substrate 100 of FIG. 1A when a temperature of the substrate 100 is raised, according to an embodiment of the inventive concept. Since the view shown in FIG. 1B is a qualitative view during the temperature increase, an actual curvature when the temperature of the substrate 100 is raised may not be as conspicuous as that shown in FIG. 1B.

As described above, the substrate 100 may be conceptually divided into the first and second portions 110a and 110b, wherein a CTE $\alpha_1$ of the first portion 110a is higher than a CTE $\alpha_2$ of the second portion 110b. The CTE $\alpha_1$ of the first portion 110a and the CTE $\alpha_2$ of the second portion 110b each refer to an overall CTE of the layers forming a corresponding portion. In other words, the CTE $\alpha_1$ of the first portion 110a will be understood to refer to the cumulative effects of thermal expansion of each layer forming the first portion 110a, and the CTE $\alpha_2$ of the second portion 110b will be understood to refer to the cumulative effects of thermal expansion of each layer forming the second portion 110b.

Since the CTE $\alpha_1$ of the first portion 110a is higher than the CTE $\alpha_2$ of the second portion 110b, an expansion in length of the first portion 110a is greater than an expansion in length of the second portion 110b during the temperature increase. As a result, an overall shape of the substrate 100 is concave downward, i.e., convex upward, as illustrated in FIG. 1B.

Various embodiments for increasing the CTE $\alpha_1$ of the first portion 110a to be higher than the CTE $\alpha_2$ of the second portion 110b will now be described. However, it would be obvious to one of ordinary skill in the art that the inventive concept is not limited to the embodiments described below. "Effective CTEs" herein refers to the differential CTEs of the first and second portions 110a, 110b regardless of how the CTEs of the two portions are differentially configured, e.g. whether by varying the thicknesses of various metal and/or PPG layers, by varying the materials of which the various metal and/or PPG layers are formed, and/or by varying other suitable dimensional and/or material characteristics of these and/or other layers and/or their stacked configuration within the substrate.

Figure 2:
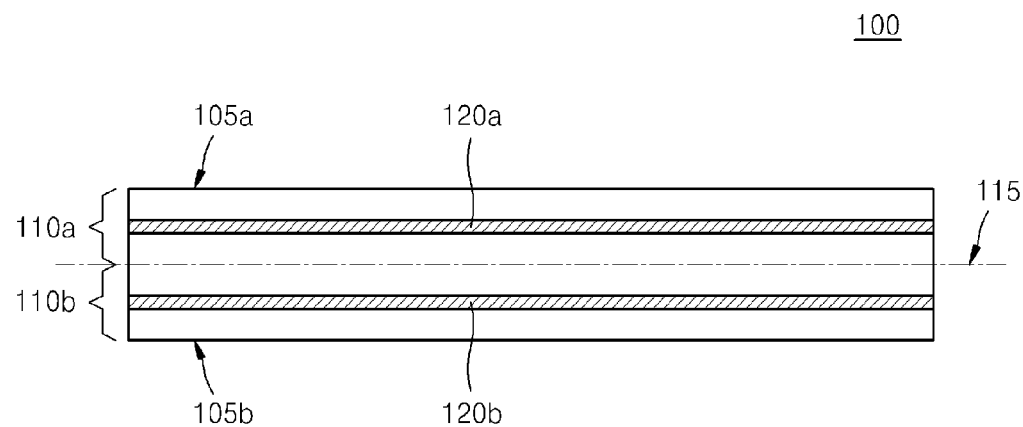
FIGS. 2 through 6 are schematic views of cross-sections of substrates according to embodiments of the inventive concept.

FIG. 2 is a cross-sectional view of the substrate 100 illustrating the inventive concept according to some embodiment. The first and second portions 110a and 110b may each include at least one PPG layer. Referring in detail to FIG. 2, the first portion 110a may include a PPG layer 120a and the second portion 110b may include a PPG layer 120b. In this case, thicknesses of the PPG layer 120a of the first portion 110a and of the PPG layer 120b of the second portion 110b may be the same, but a CTE of the PPG layer 120a of the first portion 110a may be higher than a CTE of the PPG layer 120b of the second portion 110b. A ratio of the CTE of the PPG layer 120b of the second portion 110b to the CTE of the PPG layer 120a of the first portion 110a may be, for example, within a broader range of about 1.5 to about 8 or within a narrower range of about 1.8 to about 4. Varying the CTE ratio of the first and second portions 110b and 110a will be further described below.

Other portions of the substrate 100 excluding the PPG layers 120a and 120b have a substantially symmetrical structure about the center plane 115, and corresponding portions may be formed of the same material. In detail, the other portions of the substrate 100 excluding the PPG layers 120a and 120b may include a core layer, a metal layer, an SR layer, and/or another PPG layer, but are not limited thereto.

In this case, since the CTE of the PPG layer 120a of the first portion 110a is higher than the CTE of the PPG layer 120b of the second portion 110b, an overall CTE of the first portion 110a is higher than an overall CTE of the second portion 110b. As a result, when the temperature of the substrate 100 is raised, the substrate 100 may convexly deform the first surface 105a of the first portion 110a of the substrate 100 and may concavely deform the second surface 105b of the second portion 110b of the substrate 100, as shown in FIG. 1B.

The CTEs of the PPG layers 120a and 120b may be adjusted properly by varying a type and weaving structure of a fiber, and/or by varying a type, average molecular weight, and average molecular weight distribution of a polymer used while manufacturing the PPG layers 120a and 120b. In this way, the CTEs of the PPG layers 120a and 120b determinedly and by design, in accordance with some embodiment of the invention, are configured to be advantageously different from one another.

Figure 3:
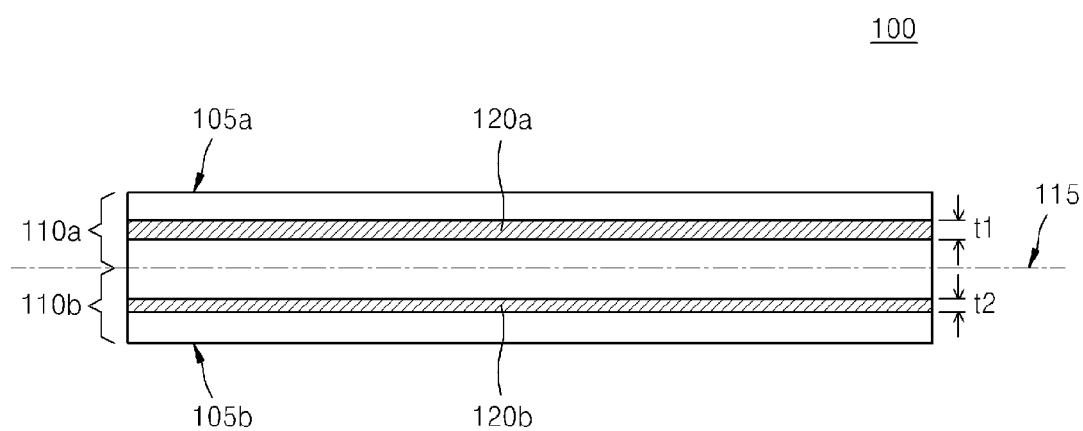

FIG. 3 is a schematic, cross-sectional view of the substrate 100 illustrating the inventive concept according to some embodiment. Referring to FIG. 3, the first and second portions 110a and 110b may each include at least one PPG layer, consistent with FIG. 2. In this case, the PPG layer 120a of the first portion 110a and the PPG layer 120b of the second portion 110b may be formed of the same material and may respectively have thicknesses t1 and t2, wherein t1>t2. In this embodiment, since a core layer (not shown) disposed between the PPG layers 120a and 120b is usually designed and configured to have a smaller CTE than the CTE of the PPG layers 120a and 120b, it is assumed that portions other than the PPG layers 120a and 120b have CTEs that are smaller than the CTEs of the PPG layers 120a and 120b. However, as described below, when the substrate 100 includes a metal layer, a CTE of the metal layers typically is higher than the CTE of the PPG layers 120a and 120b. Nevertheless, it is assumed herein that the substrate 100 is designed such that there is no difference in a thickness or CTE between metal layers or at least that there is no effect caused by the metal layers in order to prove an effect caused by different thicknesses of the PPG layers 120a and 120b.

As shown in FIG. 3, since the thickness t1 of the PPG layer 120a of the first portion 110a is greater than the thickness t2 of the PPG layer 120b of the second portion 110b, an overall CTE of the first portion 110a is higher than an overall CTE of the second portion 110b. As a result, when the temperature of the substrate 100 is raised, the substrate 100 may convexly deform toward the first surface 105a of the first portion 110a of the substrate 100, as shown in FIG. 1B. A ratio (t1/t2) of the thickness t1 of the PPG layer 120a of the first portion 110a to the thickness t2 of the PPG layer 120b of the second portion 110b may be from about 1.4 to about 5 or from about 1.8 to about 3.5.

Each of the overall CTE of the first portion 110a and the overall CTE of the second portion 110b determines the extent of any changes of lengths of the portions in terms of parts per million (ppm) or percentage (%). If the first and second portions 110a and 110b are stacked structure that includes various materials as shown in FIG. 3, then the overall CTE is proportional to a sum of expansion effects on each layer, as may be readily determined by one of ordinary skill in the art.

Figure 4:
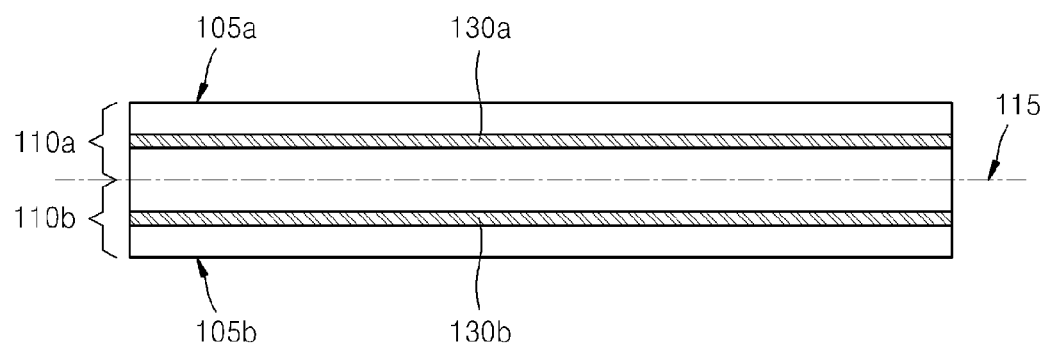

FIG. 4 is a schematic, cross-sectional view of the substrate 100 illustrating the inventive concept according to some embodiment. Referring to FIG. 4, the first and second portions 110a and 110b may each include at least one metal layer. In detail, the first portion 110a may include a first (throughout) metal layer 130a, and the second portion 110b may include a second (throughout) metal layer 130b. In this case, the metal layer 130a of the first portion 110a and the metal layer 130b of the second portion 110b may have the same thickness, but a CTE of the metal layer 130a of the first portion 110a may be higher than a CTE of the metal layer 130b of the second portion 110b. A ratio of the CTE of the metal layer 130b of the second portion 110b to the CTE of the metal layer 130a of the first portion 110a may be within a broader range of about 1.2 to about 10 or within a narrower range of about 1.5 to about 3.

Other portions of the substrate 100 excluding the metal layers 130a and 130b may have a substantially symmetrical structure about the center plane 115, and corresponding portions may be formed of the same material. In detail, the other portions of the substrate 100 excluding the metal layers 130a and 130b may include a core layer, a PPG layer, an SR layer, and/or another metal layer, but are not limited thereto.

The metal layers 130a and 130b may be formed of a metal, such as Au, Pt, Ag, Cu, Ni, Al, invar, and/or a metal alloy, but are not limited thereto.

A CTE of each material is shown in Table 1 below.

TABLE 1

| CTE of Metal for Metal Layer | |
|---|---|
| Metal | CTE (ppm/° C.) |
| Gold (Au) | 14 |
| Platinum (Pt) | 9 |
| Silver (Ag) | 18 |
| Copper (Cu) | 17 |
| Nickel (Ni) | 13 |
| Invar | 1.2 |
| Aluminum (Al) | 23 |

The material of the metal layer 130a of the first portion 110a and the material of the metal layer 130b of the second portion 110b may be selected to have a suitable relative thickness considering such CTEs.

In this case, since the CTE of the metal layer 130a of the first portion 110a is higher than the CTE of the metal layer 130b of the second portion 110b, the overall CTE of the first portion 110a is higher than the overall CTE of the second portion 110b. As a result, when the temperature of the substrate 100 is raised, the substrate 100 may convexly deform toward the first surface 105a of the first portion 110a of the substrate 100, as shown in FIG. 1B.

Figure 5:
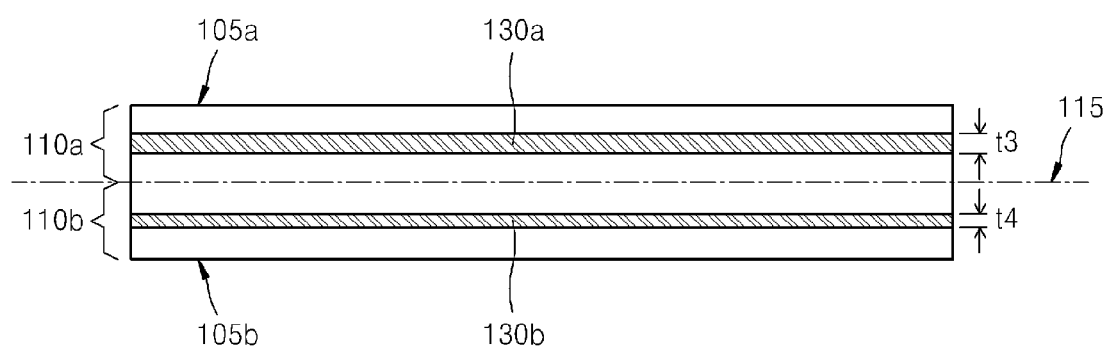

FIG. 5 is a schematic, cross-sectional view of the substrate 100 illustrating the inventive concept according to some embodiment. Referring to FIG. 5, the first and second portions 110a and 110b may each include at least one metal layer, consistent with FIG. 4. Here, the metal layer 130a of the first portion 110a and the metal layer 130b of the second portion 110b may be formed of the same material and may respectively have thicknesses t3 and t4, wherein t3>t4. In this embodiment, since the metal layers 130a and 130b are designed and configured to have the highest CTE among layers included in the substrate 100, the portions other than the metal layers 130a and 130b are assumed to have a CTE smaller than the CTE of the metal layers 130a and 130b. Also, it is assumed herein that the substrate 100 is designed such that there is no difference in a thickness or CTE between metal layers or at least that there is no effect caused by the PPG layers in order to prove an effect caused by different thicknesses of the metal layers 130a and 130b.

As shown in FIG. 5, since the thickness t3 of the metal layer 130a of the first portion 110a is greater than the thickness t4 of the metal layer 130b of the second portion 110b, the overall CTE of the first portion 110a is higher than the overall CTE of the second portion 110b. As a result, when the temperature of the substrate 100 is raised, the substrate 100 may convexly deform the first surface 105a of the first portion 110a of the substrate 100, as shown in FIG. 1B. A ratio (t3/t4) of the thickness t3 of the metal layer 130a of the first portion 110a to the thickness t4 of the metal layer 130b of the second portion 110b may be within a wider range of about 1.2 to about 5 or within a narrower range of about 1.5 to about 3.

Figure 6:
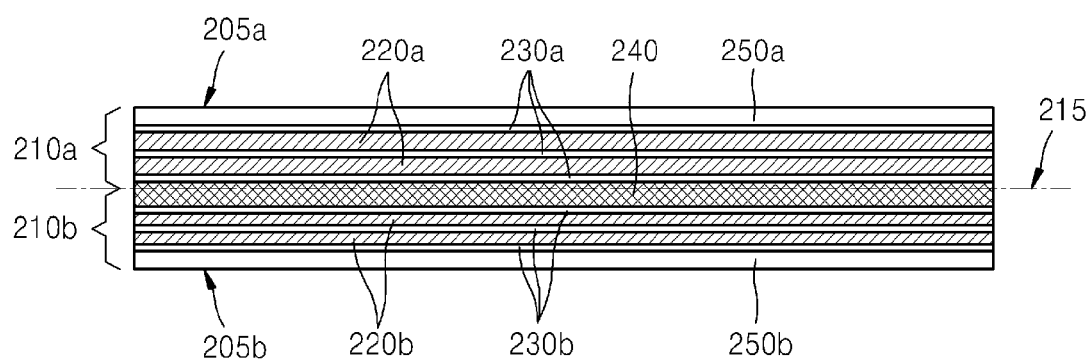

FIG. 6 is a schematic view of a cross-section of a substrate 200 according to another embodiment of the inventive concept. Referring to FIG. 6, the substrate 200 includes three metal layers 230a and two PPG layers 220a disposed between the metal layers 230a at a top of a core layer 240, and three metal layers 230b and two PPG layers 220b disposed between the metal layers 230b at a bottom of the core layer 240. Also, SR layers 250a and 250b are disposed on outermost portions of the substrate 200, and exposed outer surfaces of the SR layers 250a and 250b may be first and second surfaces 205a and 205b, respectively. Here, the substrate 200 includes six metal layers 230a and 230b in total, but the substrate 200 may include more or fewer metal layers. Also, the substrate 200 includes four PPG layers 220a and 220b in total, but the substrate 200 may include more or fewer PPG layers.

Like the PPG layer 220a or 220b, the core layer 240 may be a layer formed by impregnating a matrix fiber, such as a glass fiber or a carbon fiber, with a polymer, such as an epoxy resin, a phenol resin, or a polyimide resin. The matrix fiber may be oriented in one direction or it may be woven in a cross-pattern. The core layer 240 may be used in a hardened or cured state while manufacturing the substrate 200.

A central or center plane 215 that is defined as a plane substantially equally spaced apart from the first surface 205a and from the second surface 205b may or may not coincide with a central or center plane of the core layer 240. In FIG. 6, the center plane 215 is shown to be disposed within the core layer 240, but alternatively, the substrate 200 may be configured such that the center plane 215 is disposed outside the core layer 240.

When the center plane 215 of the substrate 200 coincides with the center plane of the core layer 240, compositions of a first portion 210a and a second portion 210b are different from each other. In this case, compositions of layers, for example, thicknesses of layers and/or CTE of materials, forming the first and second portions 210a and 210b are different. However, such differences are adjusted such that an overall CTE of layers forming the first portion 210a is higher than an overall CTE of the layers forming the second portion 210b. Detailed embodiments will now be described.

Figure 7:
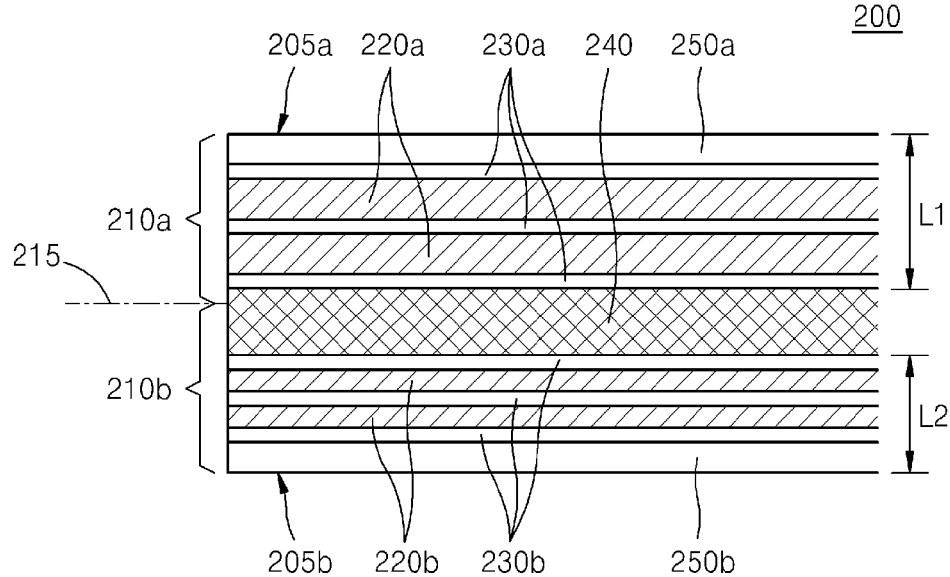
FIGS. 7 through 12 are schematic views of fragmentary side cross-sections of substrates according to embodiments of the inventive concept.

FIG. 7 is a cross-sectional and more detailed and less schematic view of the substrate 200 according to an embodiment of the inventive concept. Referring to FIG. 7, thicknesses of the one or more PPG layer 220a disposed nearer the first surface 205a relative to the core layer 240 are greater than thicknesses of the one or more PPG layers 220b disposed nearer the second surface 205b relative to the core layer 240. In this case, the two or more PPG layers 220a and 220b may be formed of the same material. Also, materials and thicknesses of the metal layers 230a and 230b and the SR layers 250a and 250b are the same on either side of the core layer 240.

As such, the different thicknesses of the PPG layers 220a and 220b at both sides of the core layer 240 results in a thickness L1 from the core layer 240 to the first surface 205a that is greater than a thickness L2 from the core layer 240 to the second surface 205b.

If the thicknesses of the PPG layers 220a of the first portion 210a are thicker than the thicknesses of the PPG layers 220b of the second portion 210b, the effect of thermal expansion according to a temperature increase is greater in the first portion 210a. This is because a CTE of the SR layers 250a and 250b and the core layer 240 is lower than a CTE of the PPG layers 220a and 220b, and a contribution from the one or more PPG layers 220a to the overall CTE of the first portion 210a is greater than a contribution from the one or more PPG layers 220b to the overall CTE of the second portion 210b.

Accordingly, a deformation due to thermal expansion of the first portion 210a is larger than a deformation due to thermal expansion of the second portion 210b as the temperature increases, and thus, the substrate 200 has a so-called 'cry shape' (or a shape suggestive of an upside-down smile, i.e. a frowning or crying mouth shape) wherein a central or center portion of the substrate 200 extends convexly upward.

Alternatively, according to another embodiment, in addition to differentiating thicknesses between the PPG layers 220a and 220b, as shown in FIG. 7, materials may be selected such that the CTEs of materials forming the PPG layers 220a disposed nearer the first surface 205a based on the core layer 240 are higher than the CTEs of materials forming the PPG layers 220b disposed nearer the second surface 205b based on the core layer 240, thereby increasing an effect of creating the cry shape.

Figure 8:
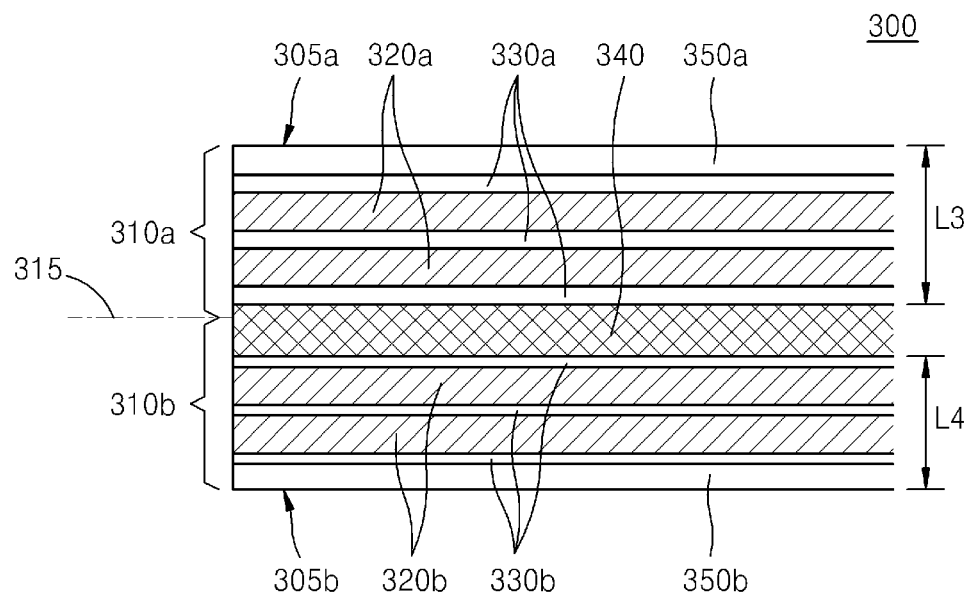

FIG. 8 is a schematic view of a part of a side cross-section of a substrate 300, according to an embodiment of the inventive concept. Referring to FIG. 8, thicknesses of metal layers 330a disposed nearer a first surface 305a relative to a core layer 340 are thicker than thicknesses of metal layers 330b disposed nearer a second surface 305b relative to the core layer 340. In this case, the metal layers 330a and 330b may be formed of the same material. Also, materials and thicknesses of PPG layers 320a and 320b and SR layers 350a and 350b are the same on both sides of the core layer 340.

As such, the different thicknesses of the metal layers 330a and 330b disposed on either side of the core layer 340 results in a distance L3 from the core layer 340 to the first surface 305a that is greater than a distance L4 from the core layer 340 to the second surface 305b.

When the thicknesses of the metal layers 330a of a first portion 310a are greater than the thicknesses of the metal layers 330b of a second portion 310b, the effect of thermal expansion according to a temperature increase is higher in the first portion 310a. This is because a CTE of the SR layers 350a and 350b, the core layer 340, and the PPG layers 320a and 320b is lower than a CTE of the metal layers 330a and 330b, and a contribution from the metal layers 330a to an overall CTE of the first portion 310a is greater than a contribution from the metal layers 330b to an overall CTE of the second portion 310b.

Accordingly, the deformation due to thermal expansion of the first portion 310a is larger than the deformation due to thermal expansion of the second portion 310b as the temperature increases, and thus, the substrate 300 has a cry shape wherein a central or center portion of the substrate 300 extends convexly upward.

Alternatively, according to another embodiment, in addition to making the thicknesses of the metal layers 330a and 330b different, as shown in FIG. 8, materials may be selected such that the CTE of materials forming the metal layers 330a disposed nearer the first surface 305a relative to the core layer 340 is higher than the CTE of materials forming the metal layers 330b disposed nearer the second surface 305b relative to the core layer 340. As a result, the cry shape can be more easily formed.

Figure 9:
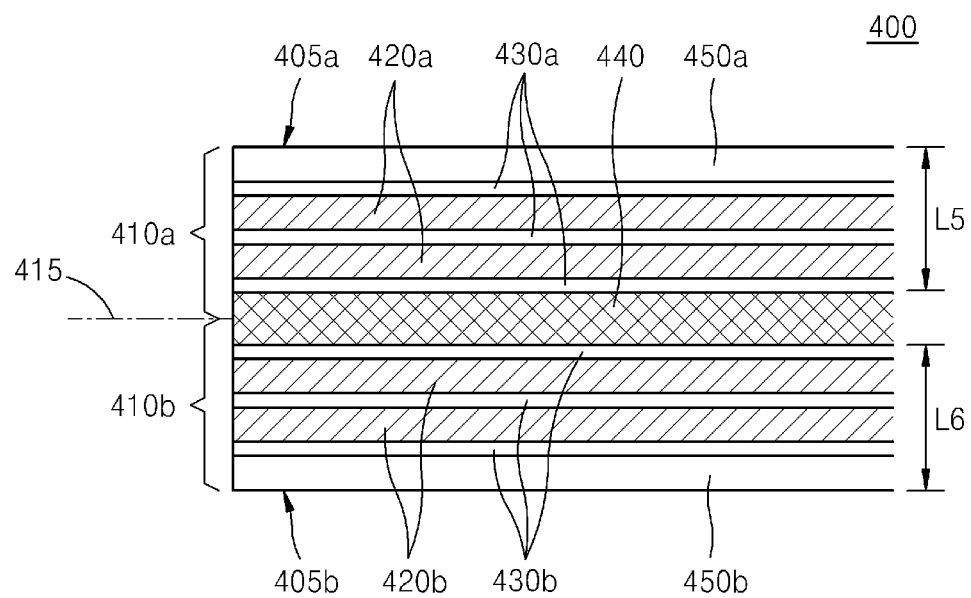

FIG. 9 is a cross-sectional schematic view of a substrate 400 illustrating the inventive concept according to some embodiments. SR layers 450a and 450b are disposed on outermost portions of the substrate 400, and exposed outer surfaces of the SR layers 450a and 450b may be first and second surfaces 405a and 405b, respectively. Further, metal layers 430a and PPG layers 420a disposed nearer the first surface 405a and metal layers 430b and PPG layers 420b disposed nearer the second surface 405b may be arranged in a symmetrical configuration about a core layer 440. Also, unlike FIGS. 7 and 8, a thickness L5 from an upper outer surface of the core layer 440 to the first surface 405a may be substantially the same as a thickness L6 from a lower outer surface the core layer 440 to the second surface 405b. In this case, in order to adjust an overall CTE of a first portion 410a to be higher than an overall CTE of a second portion 410b, the CTEs of the metal layers 430a and/or PPG layers 420a of the first portion 410a may be higher than the CTEs of the metal layers 430b and/or PPG layers 420b of the second portion 410b.

Accordingly, the deformation resulting from thermal expansion of the first portion 410a may be larger than the deformation resulting from the thermal expansion of the second portion 410b as the temperature increases. Therefore, the substrate 400 has a cry shape wherein a central or center portion of the substrate 400 extends convexly upward.

In the above description, the center planes 215, 315, and 415 are disposed within the core layers 240, 340, and 440, respectively. Alternatively, the central or center planes 215, 315, or 415 may not be disposed within the core layer 240, 340, or 440 if the thickness of the metal layer 230a, 330a, or 430a and/or the PPG layer 220a, 320a, or 420a forming the first portion 210a, 310a, or 410a is thicker than the thickness of the metal layer 230b, 330b, or 430b and/or the PPG layer 220b, 320b, or 420b forming the second portion 210b, 310b, or 410b by a predetermined value or above, as will be described below.

Figure 10:
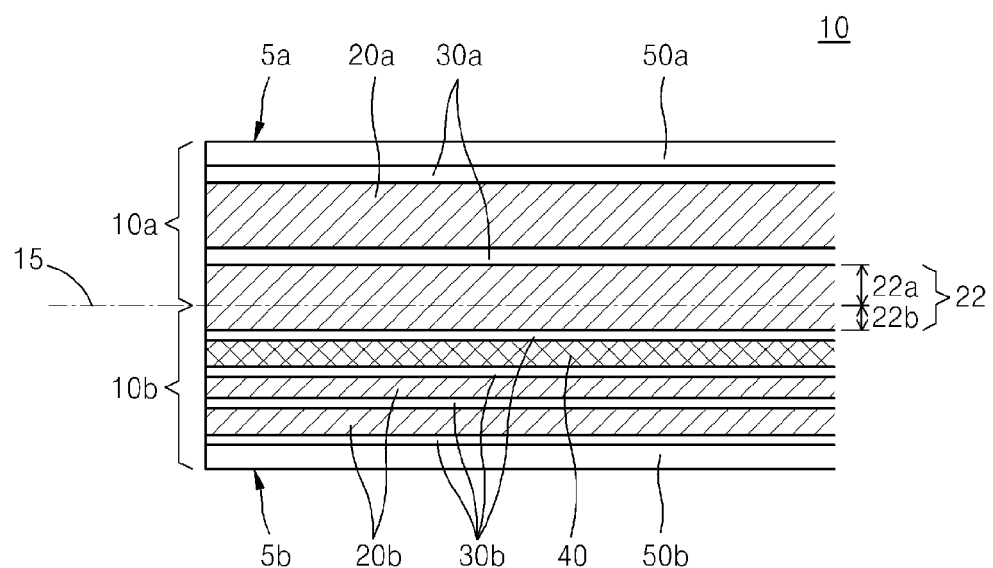

FIG. 10 is a cross-sectional schematic view of a substrate 10 where a central or center plane 15 is disposed within a PPG layer 22, according to an embodiment of the inventive concept. SR layers 50a and 50b are disposed on outermost portions of the substrate 10, and exposed outer surfaces of the SR layers 50a and 50b may be first and second surfaces 5a and 5b, respectively. Also, the substrate 10 includes a core layer 40, metal layers 30a disposed nearer the first surface 5a, and metal layers 30b disposed nearer the second surface 5b. As shown in FIG. 10, a part 22a of the PPG layer 22 through which the center plane 15 extends may be defined as a part of a first portion 10a, and the remaining part 22b may be defined as a part of a second portion 10b. In this case, a thickness of a PPG layer of the first portion 10a may be defined to be a sum of a thickness of a PPG layer 20a (or, if there are plural PPG layers 20a, then a sum of thicknesses of the PPG layers 20a) and the part 22a of the PPG layer 22 above the center plane 15. Also, a thickness of a PPG layer of the second portion 10b may be defined to be a sum of a thickness of a PPG layer 20b (or, if there are plural PPG layers 20b, then a sum of thicknesses of the PPG layers 20b) and the remaining part 22b of the PPG layer 22 below the center plane 15.

Such a concept of defining the core layer 22 as including upper and lower parts 22a and 22b that contribute to first portions 10a and 10b, respectively, applies equally to one or more metal layers instead of or in addition to one or more PPG layers.

Accordingly, it would be obvious to one of ordinary skill in the art that the embodiments described with reference to FIGS. 6 through 10 may be applied to either or both of the thickness of one or more PPG layers and/or the thickness of one or more metal layers, as described above.

Figure 11:
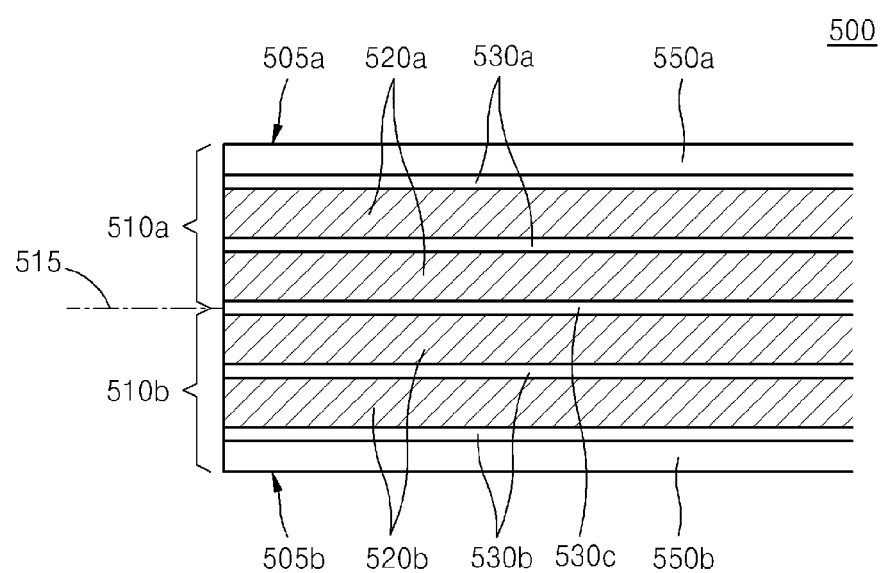

FIG. 11 is a cross-sectional schematic view of a substrate 500 according to an embodiment of the inventive concept. Referring to FIG. 11, the metal layers 530a, 530b, and 530c are disposed between the SR layers 550a and 550b that respectively form the first and second surfaces 505a and 505b, and the PPG layers 520a and 520b are disposed between the metal layers 530a, 530b, and 530c. In this case, five metal layers 530a, 530b, and 530c in total are shown, but one of ordinary skill in the art will appreciate that any odd number of metal layers may be included.

Since the number of metal layers 530a, 530b, and 530c is an odd number, the metal layer 530c is in the middle, and a central or center plane of the a central layer such as metal layer 530c in the middle may be co-planar with a central or center plane 515. Also, the thicknesses and the arrangement of the metal layers 530a and PPG layers 520a of a first portion 510a may be the same as the thicknesses and the arrangement of the metal layers 530b and PPG layers 520b of a second portion 510b. In this case, in order to adjust an overall CTE of the first portion 510a to be higher than an overall CTE of the second portion 510b, the CTE of the metal layers 530a and/or PPG layers 520a of the first portion 510a may be selected to be higher than the CTE of the metal layers 530b and/or PPG layers 520b of the second portion 510b.

Accordingly, the deformation resulting from the thermal expansion of the first portion 510a is greater than the deformation resulting from the thermal expansion of the second portion 510b as the temperature rises. As a result, the substrate 500 may have a cry shape where a central or center portion of the substrate 500 extends convexly upward.

Because the metal layer 530c in the middle does not substantially influence a curve or shape deformation. i.e. warpage, direction of the substrate 500, the metal layer 530c in the middle may have an arbitrary CTE.

Figure 12:
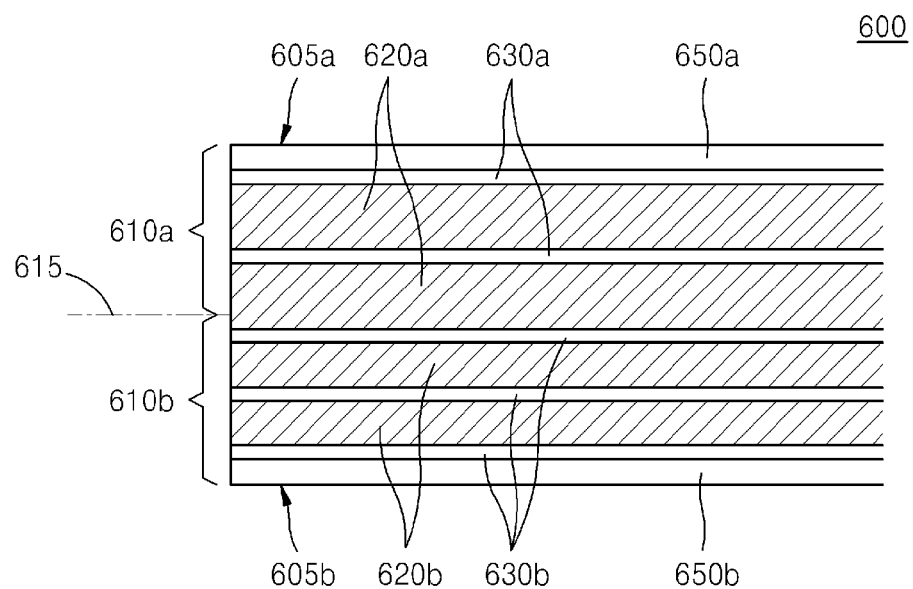

FIG. 12 is a cross-sectional schematic view of a substrate 600 according to an embodiment of the inventive concept. SR layers 650a and 650b are disposed on outermost portions of the substrate 600, and exposed outer surfaces of the SR layers 650a and 650b may be first and second surfaces 605a and 605b, respectively. Also, a center plane 615 is illustrated in FIG. 12.

Figure 13:
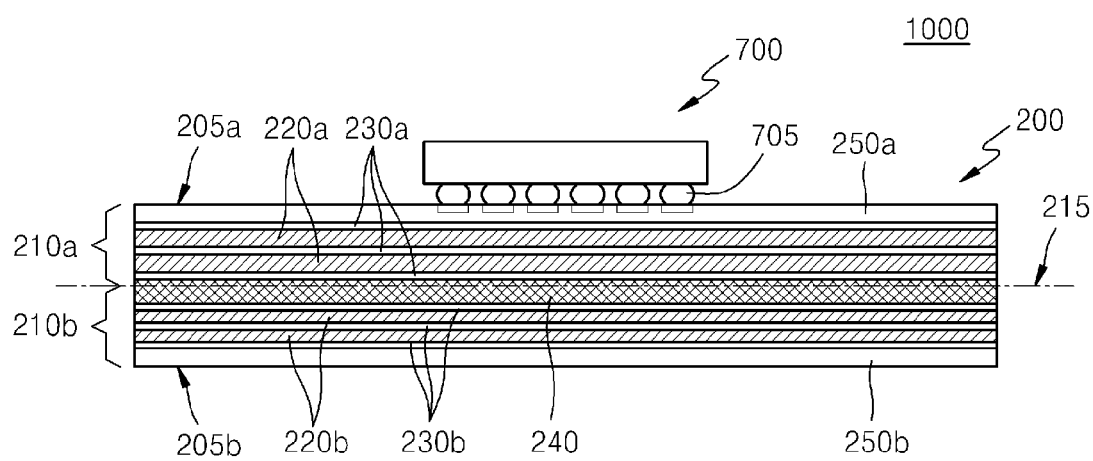
FIG. 13 is a side cross-sectional view showing an electronic device wherein a semiconductor package or a semiconductor die is mounted on a substrate according to an embodiment of the inventive concept.

FIG. 13 is a side cross-sectional view showing an electronic device 1000 wherein a semiconductor package or semiconductor die 700 may be mounted on the substrate 200, according to an embodiment of the inventive concept. Referring in detail to FIG. 13, the semiconductor package or semiconductor die 700 may be electrically and physically connected to the substrate 200 via one or more a connection terminals such as terminal 705. In other words, a bare semiconductor die may be directly mounted on the substrate 200, or one or more semiconductor packages formed by encapsulating a semiconductor die may be mounted on the substrate 200.

Examples of the semiconductor packages include a chip scale package (CSP), a wafer level package (WLP), a ball grid array (BGA) package, a pin grid array (PGA) package, a flip chip package, a through hole package, a direct chip attach (DCA) package, a quad flat package (QFP), a quad flat no-lead (QFN) package, a dual in-line package (DIP), a single in-line package (SIP), a zigzag in-line package (ZIP), a tape carrier package (TCP), a multi-chip package (MCP), a small outline package (SOP), and/or a through silicon via (TSV) package, but are not limited thereto.

Although not shown in FIG. 13, the electronic device 1000 may further include an encapsulation material for encapsulating the semiconductor die 700.

When a semiconductor die or semiconductor package is mounted on a conventional substrate, the substrate may be deformed to a smile shape, where a central or center portion of the substrate extends concavely upward, due to the CTE differences of the substrate's components during a temperature increase. However, the deformation in the overall shape of the substrate may be reduced or relieved by using a substrate formed according to an embodiment of the inventive concept. This is because the deformation due to a cry shape in the substrate according to some embodiments counteracts, e.g. relieves or neutralizes, the conventional and undesirable deformation due to a smile shape.

Experiment Example 1

Substrates having stacked structures shown in Table 2 below were manufactured by varying the PPGS layers' CTEs slightly and by varying their thicknesses more dramatically.

TABLE 2

Experiment Example 1 and Comparative Example 1 for Substrate Manufacture

| | Experiment Example 1 | | Comparative Example 1 | |
|---|---|---|---|---|
| | Thickness (μm) | CTE | Thickness (μm) | CTE |
| SR Layer | 15 | | 15 | |
| Cu Layer | 15 | | 15 | |
| PPG Layer | 50 | 16 | 30 | 16.7 |
| Cu Layer | 15 | | 15 | |
| PPG Layer | 50 | 16 | 30 | 16.7 |
| Cu Layer | 15 | | 15 | |
| Core Layer | 100 | 5.3 | 100 | 5.3 |
| Cu Layer | 15 | | 15 | |
| PPG Layer | 10 | 16 | 30 | 16.7 |
| Cu Layer | 15 | | 15 | |
| PPG Layer | 10 | 16 | 30 | 16.7 |
| Cu Layer | 15 | | 15 | |
| SR Layer | 15 | | 15 | |

A semiconductor die was mounted on each substrate formed as described above, and then was encapsulated by an epoxy molding compound (EMC) resin to manufacture a semiconductor package. Also, a warpage of the semiconductor package was measured at 25° C. and at 240° C.

As a result, the semiconductor package of Experiment Example 1 showed a warpage of −117 micrometers (μm) at 25° C., whereas the semiconductor package of Comparative Example 1 showed a warpage of −163 μm at 25° C. In other words, the undesirable warpage was reduced by about 28%. In this case, a warpage in a negative (−) direction denotes a deformation of the substrate into a cry shape, as illustrated in FIG. 1B.

Also, the semiconductor package of Experiment Example 1 showed a warpage of +73 μm at 240° C., whereas the semiconductor package of Comparative Example 1 showed a warpage of +107 μm at 240° C. In other words, the undesirable warpage at higher temperatures was reduced even more dramatically by about 32%. Here, a warpage in a positive (+) direction denotes a deformation of the substrate into a smile shape, the opposite of the effect illustrated in FIG. 1B.

Experiment Example 2

Substrates having stacked structures shown in Table 3 below were manufactured by varying the PPG layers' relative CTS dramatically while maintaining their thicknesses constant.

TABLE 3

Experiment Example 2 and Comparative Example 2 for Substrate Manufacture

| | Experiment Example 2 | | Comparative Example 2 | |
|---|---|---|---|---|
| | Thickness (μm) | CTE | Thickness (μm) | CTE |
| SR Layer | 15 | | 15 | |
| Cu Layer | 15 | | 15 | |
| PPG Layer | 30 | 33 | 30 | 16.7 |
| Cu Layer | 15 | | 15 | |
| PPG Layer | 30 | 33 | 30 | 16.7 |
| Cu Layer | 15 | | 15 | |
| Core Layer | 100 | 5.3 | 100 | 5.3 |
| Cu Layer | 15 | | 15 | |
| PPG Layer | 30 | 10 | 30 | 16.7 |
| Cu Layer | 15 | | 15 | |
| PPG Layer | 30 | 10 | 30 | 16.7 |
| Cu Layer | 15 | | 15 | |
| SR Layer | 15 | | 15 | |

Semiconductor packages were manufactured as in the case above for Experiment Example 1 and Comparative Example 1 with respect to the substrates configured as described above, but with higher CTE ratios, as tabulated in Table 3. Again, a warpage of each semiconductor package was measured at 25° C. and 240° C.

As a result, the semiconductor package of Experiment Example 2 showed a warpage of −95 μm at 25° C., whereas the semiconductor package of Comparative Example 2 showed a warpage of −163 μm at 25° C. In other words, the undesirable warpage of the substrate was reduced even more dramatically by about 42%.

Also, the semiconductor package of Experiment Example 2 showed a warpage of +88 μm at 240° C., whereas the semiconductor package of Comparative Example 2 showed a warpage of +107 μm at 240° C. In other words, the undesirable warpage of the substrate at higher temperatures was reduced by about 18%.

Experiment Example 3

Substrates having stacked structures shown in Table 4 below were manufactured by varying the PPG layers' relative thicknesses dramatically while maintaining their CTEs constant.

TABLE 4

Experiment Example 3 and Comparative Example 3 for Substrate Manufacture

| | Experiment Example 3 | | Comparative Example 3 | |
|---|---|---|---|---|
| | Thickness (μm) | CTE | Thickness (μm) | CTE |
| SR Layer | 15 | | 15 | |
| Cu Layer | 25 | | 15 | |
| PPG Layer | 30 | 16.7 | 30 | 16.7 |
| Cu Layer | 20 | | 15 | |
| PPG Layer | 30 | 16.7 | 30 | 16.7 |
| Cu Layer | 20 | | 15 | |
| Core Layer | 100 | 5.3 | 100 | 5.3 |
| Cu Layer | 10 | | 15 | |
| PPG Layer | 3 | 16.7 | 30 | 16.7 |
| Cu Layer | 10 | | 15 | |
| PPG Layer | 30 | 16.7 | 30 | 16.7 |
| Cu Layer | 5 | | 15 | |
| SR Layer | 15 | | 15 | |

Semiconductor packages were manufactured as in the case above for Experiment Example 1 and Comparative Example 1 with respect to the substrates configured as described above. Again, a warpage of each semiconductor package was measured at 25° C. and 240° C.

As a result, the semiconductor package of Experiment Example 3 showed a warpage of −105 μm at 25° C., whereas the semiconductor package of Comparative Example 3 showed a warpage of −163 μm at 25° C. In other words, the undesirable warpage of the substrate was reduced by about 36%.

Also, the semiconductor package of Experiment Example 3 showed a warpage of +79 μm at 240° C., whereas the semiconductor package of Comparative Example 3 showed a warpage of +107 μm at 240° C. In other words, the undesirable warpage of the substrate was improved by about 26%.

While the inventive concept has been particularly shown and described with reference to exemplary embodiments thereof, it will be understood that various changes in form and details may be made therein without departing from the spirit and scope of the following claims.

What is claimed is:

1. A substrate comprising a first surface for mounting a semiconductor package or a semiconductor die thereon, and a second surface disposed opposite the first surface,
   wherein, with respect to a center plane disposed between the first surface and the second surface at equal distances, a coefficient of thermal expansion in a first portion between the first surface and the center plane is higher than a coefficient of thermal expansion in a second portion between the second surface and the center plane.

2. The substrate of claim 1, wherein the first and second portions each comprise at least one prepreg (PPG) layer, wherein a coefficient of thermal expansion of a material forming the at least one PPG layer of the first portion is higher than a coefficient of thermal expansion of a material forming the at least one PPG layer of the second portion.

3. The substrate of claim 1, wherein the first and second portions each comprise at least one PPG layer, wherein a thickness of the at least one PPG layer of the first portion is thicker than a thickness of the at least one PPG layer of the second portion.

4. The substrate of claim 1, wherein the first and second portions each comprise at least one metal layer, wherein a coefficient of thermal expansion of a material forming the at least one metal layer of the first portion is higher than a coefficient of thermal expansion of a material forming the at least one metal layer of the second portion.

5. The substrate of claim 1, wherein the first and second portions each comprise at least one metal layer, wherein a thickness of the at least one metal layer of the first portion is thicker than a thickness of the at least one metal layer of the second portion.

6. The substrate of claim 1, wherein the substrate comprises: solder resist (SR) layers forming the first and second surfaces; a core layer disposed between the SR layers; and a metal layer and a prepreg (PPG) layer disposed between the core layer and the SR layer,
wherein the metal layer and the PPG layer disposed between the first surface and the core layer and the metal layer and the PPG layer disposed between the second surface and the core layer are disposed in a symmetrical configuration about the core layer, and
wherein a thickness from the core layer to the first surface is thicker than a thickness from the core layer to the second surface.

7. The substrate of claim 6, wherein a thickness of the metal layer disposed between the first surface and the core layer is thicker than a thickness of the metal layer disposed between the second surface and the core layer.

8. The substrate of claim 6, wherein a thickness of the PPG layer disposed between the first surface and the core layer is thicker than a thickness of the PPG layer disposed between the second surface and the core layer.

9. The substrate of claim 8, wherein a coefficient of thermal expansion of a material forming the PPG layer disposed between the first surface and the core layer is higher than a coefficient of thermal expansion of a material forming the PPG layer disposed between the second surface and the core layer.

10. The substrate of claim 1, wherein the substrate comprises: solder resist (SR) layers forming the first and second surfaces; a core layer disposed between the SR layers, and a metal layer and a prepreg (PPG) layer disposed between the core layer and the SR layers,
wherein the metal layer and the PPG layer disposed between the first surface and the core layer and the metal layer and the PPG layer disposed between the second surface and the core layer are disposed in a symmetrical configuration about the core layer,
wherein a thickness from the core layer to the first surface is substantially the same as a thickness from the core layer to the second surface, and
wherein a coefficient of thermal expansion of a material forming the PPG layer disposed between the first surface and the core layer is higher than a coefficient of thermal expansion of a material forming the PPG layer disposed between the second surface and the core layer.

11. The substrate of claim 1, wherein the substrate comprises: solder resist (SR) layers forming the first and second surfaces; a core layer disposed between the SR layers, and a metal layer and a prepreg (PPG) layer disposed between the core layer and the SR layer,
wherein the metal layer and the PPG layer disposed between the first surface and the core layer and the metal layer and the PPG layer disposed between the second surface and the core layer are disposed in a symmetrical configuration about the core layer,
wherein a thickness from the core layer to the first surface is substantially the same as a thickness from the core layer to the second surface, and
wherein a coefficient of thermal expansion of a material forming the metal layer disposed between the first surface and the core layer is configured to be higher than a coefficient of thermal expansion of a material forming the metal layer disposed between the second surface and the core layer is configured to be.

12. The substrate of claim 1, wherein the substrate comprises: solder resist (SR) layers forming the first and second surfaces; at least three odd-numbered metal layers disposed between the SR layers; and prepreg (PPG) layers disposed between the at least three odd-numbered metal layers,
wherein a coefficient of thermal expansion of the PPG layer disposed between the center plane and the first surface is configured to be higher than a coefficient of thermal expansion of the PPG layer disposed between the center plane and the second surface is configured to be.

13. The substrate of claim 1, wherein the substrate comprises solder resist (SR) layers forming the first and second surfaces; at least three odd-numbered metal layers disposed between the SR layers; and prepreg (PPG) layers disposed between the at least three odd-numbered metal layers,
wherein a coefficient of thermal expansion of the metal layer disposed between the center plane and the first surface is configured to be higher than a coefficient of thermal expansion of the metal layer disposed between the center plane and the second surface is configured to be.

14. An electronic device comprising:
the substrate of claim 1; and
a semiconductor package or a semiconductor die installed on the substrate.

15. A substrate comprising a first surface configured for mounting a semiconductor package or a semiconductor die thereon and a second surface facing the first surface,
wherein the substrate further comprises: solder resist (SR) layers forming the first and second surfaces; a core layer disposed between the SR layers; and one or more metal layers and one or more prepreg (PPG) layers disposed between the core layer and either of the SR layers, and
wherein an overall coefficient of thermal expansion of layers between the core layer and the first surface is configured to be higher than an overall coefficient of thermal expansion of layers between the core layer and the second surface is configured to be.

16. A substrate comprising a first surface for mounting a semiconductor package or a semiconductor die thereon, and a second surface disposed opposite the first surface, wherein, with respect to a central plane disposed substantially equidistant from the first and second surfaces, an effective coefficient of thermal expansion (CTE) in a first portion between the first surface and the central plane is higher than an effective CTE in a second portion between the central plane and the second surface.

17. The substrate of claim 16, wherein the effective CTEs in the first portion and in the second portion are differently configured by varying the CTEs of materials from which the first and second portions are manufactured.

18. The substrate of claim 16, wherein the effective CTEs in the first portion and in the second portion are differently configured by varying the thicknesses of the materials from which the first and second portions are manufactured.

19. The substrate of claim 16, wherein the substrate further comprises solder resist (SR) layers forming the first and second surfaces; a core layer disposed between the SR layers, and one or more metal layers and one or more prepreg (PPG) layers disposed between the core layer and either of the SR layers, wherein the one or more metal layers and the one or more PPG layers disposed between the first surface and the core layer and the one or more metal layers and the one or more PPG layers disposed between the core layer and the second surface are disposed in a symmetrical configuration about the core layer.

20. The substrate of claim 19, wherein a thickness from the first surface to the core layer is substantially the same as a thickness from the core layer to the second surface, and wherein a CTE of a material forming at least one of the one or more metal layers and the one or more PPG layers disposed between the first surface and the core layer is higher than a CTE of a material forming at least one of the one or more metal layers and the one or more PPG layers disposed between the core layer and the second surface.

* * * * *